(12) United States Patent
Wu et al.

(10) Patent No.: US 11,109,477 B2
(45) Date of Patent: Aug. 31, 2021

(54) HEAT SINK FASTENING MECHANISM FOR USE WITH ELECTRICAL CONNECTOR

(71) Applicants: FUDING PRECISION COMPONENTS (SHENZHEN) CO., LTD., Shenzhen (CN); FOXCONN INTERCONNECT TECHNOLOGY LIMITED, Grand Cayman (KY)

(72) Inventors: Heng-Kang Wu, Kunshan (CN); Gong-Cheng Liu, Kunshan (CN); Fu-Jin Peng, Kunshan (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/900,094

(22) Filed: Jun. 12, 2020

(65) Prior Publication Data

US 2020/0396825 A1    Dec. 17, 2020

(30) Foreign Application Priority Data

Jun. 12, 2019    (CN) .......................... 201910505410.4

(51) Int. Cl.
*H05K 1/02* (2006.01)
*H05K 1/18* (2006.01)
*H01R 12/82* (2011.01)

(52) U.S. Cl.
CPC ........... *H05K 1/0203* (2013.01); *H05K 1/181* (2013.01); *H01R 12/82* (2013.01);
(Continued)

(58) Field of Classification Search
CPC ................. H05K 1/0203; H05K 1/181; H05K 2201/10393; H05K 2201/10409;
(Continued)

(56) References Cited

U.S. PATENT DOCUMENTS

| 2012/0216988 A1* | 8/2012 | Kang .................. H01L 23/4093 165/67 |
| 2018/0175538 A1* | 6/2018 | Wu ....................... H01R 13/447 |

(Continued)

FOREIGN PATENT DOCUMENTS

| CN | 207459230 U | 6/2018 |
| CN | 110838632 A | 2/2020 |

*Primary Examiner* — Sherman Ng
(74) *Attorney, Agent, or Firm* — Ming Chieh Chang; Wei Te Chung

(57) ABSTRACT

A fastening mechanism for retaining a heat sink upon the CPU includes a fastening seat surrounding the connector, and a pair of fastening clips. The fastening seat includes four alignment posts at four corners, and the pair of fastening clips are attached at two corresponding diagonal corners. Each fastening clip includes a mounting section secured to the corresponding post, a latching section for temporarily holding the heat sink, and a resilient arm for upwardly urging the heat sink. Each alignment post is equipped with a screw nut and a coil spring so as to reinforce the downward pressing forces against the heat sink for assuring reliable connection between the CPU and the contacts of the electrical connector for better electrical transmission and intimate contact between the CPU and the heat sink for efficient heat dissipation.

20 Claims, 8 Drawing Sheets

(52) U.S. Cl.
CPC ............. *H05K 2201/10189* (2013.01); *H05K 2201/10393* (2013.01); *H05K 2201/10409* (2013.01)

(58) Field of Classification Search
CPC .......... H05K 2201/10189; H01L 23/40; H01L 23/4006; H01L 23/4093
USPC ........................................................ 361/720
See application file for complete search history.

(56) References Cited

U.S. PATENT DOCUMENTS

2019/0304870 A1\* 10/2019 Boyd .................. H01L 23/4093
2019/0306985 A1\* 10/2019 Ferguson ............... H01R 12/88

\* cited by examiner

HEAT SINK FASTENING MECHANISM FOR USE WITH ELECTRICAL CONNECTOR

BACKGROUND OF THE INVENTION

1. Field of the Invention

The present invention relates generally to a heat sink fastening mechanism, and particularly to the heat sink fastening mechanism for use with an electrical connector which receives a CPU (Central Processing Unit).

2. Description of Related Arts

U.S. Patent Application Publication No. 2019/0115282 discloses a heat sink fastening seat for use with an electrical connector receiving a CPU wherein the heat sink is downwardly pressed by the corresponding coil springs against the CPU thereunder. Anyhow, the heat sink may be tilted during fastening the nut to the corresponding screw on one side.

It is desired to provide heat sink fastening mechanism for temporarily and gently holding the heat sink in position upon the CPU before the heat sink is completely retained upon the CPU by fastening the screw nuts to the corresponding screws to have the CPU fully endure the forces exerted by the spring.

SUMMARY OF THE INVENTION

To achieve the above object, a fastening mechanism for retaining a heat sink upon the CPU includes a fastening seat surrounding the connector, and a pair of fastening clips. The fastening seat includes four alignment posts at four corners, and the pair of fastening clips are attached at two corresponding diagonal corners. Each fastening clip includes a mounting section secured to the corresponding post, a latching section for temporarily holding the heat sink, and a resilient arm for upwardly urging the heat sink, Each alignment post is equipped with a screw nut and a coil spring so as to reinforce the downward pressing forces against the heat sink for assuring reliable connection between the CPU and the contacts of the electrical connector for better electrical transmission and intimate contact between the CPU and the heat sink for efficient heat dissipation.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
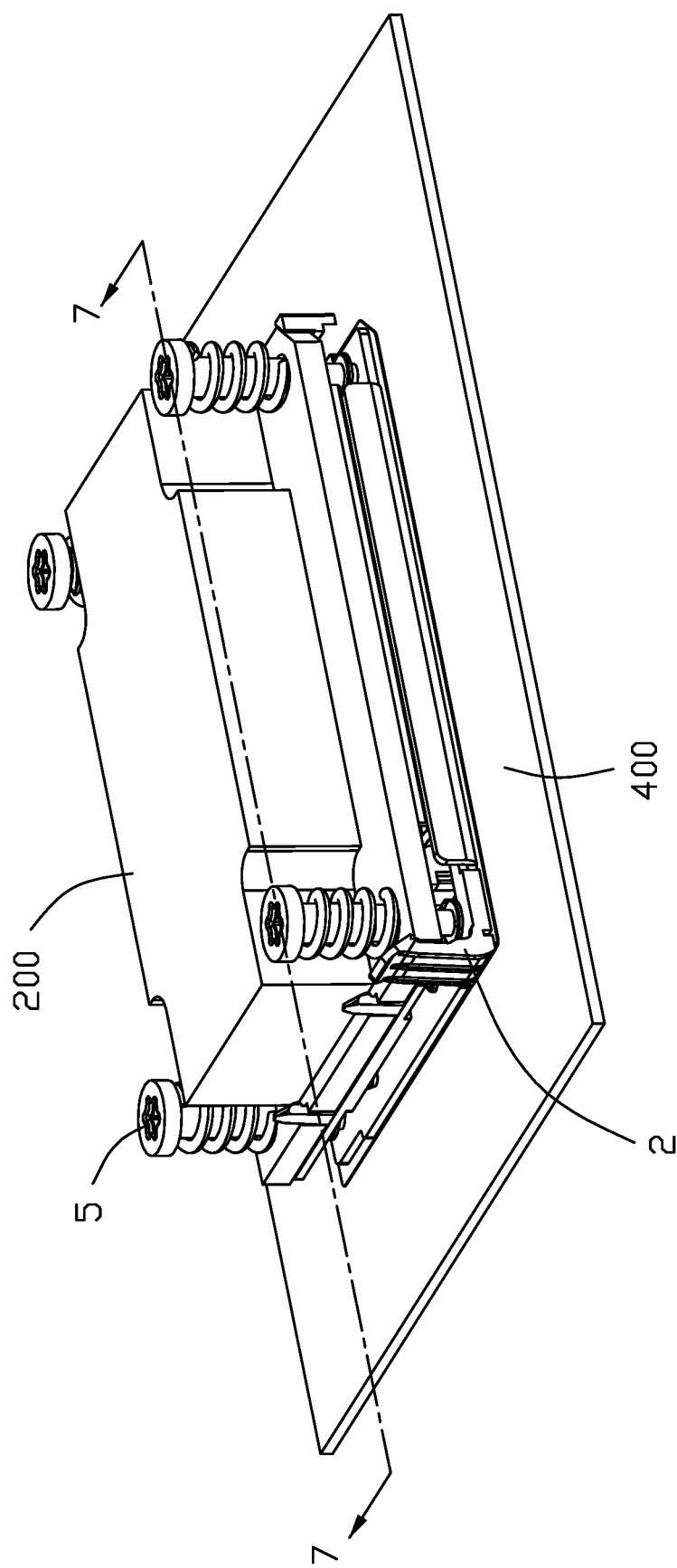
FIG. 1 is a perspective view of the electrical connector assembly mounted upon the printed circuit board according to the present invention.
Figure 2:
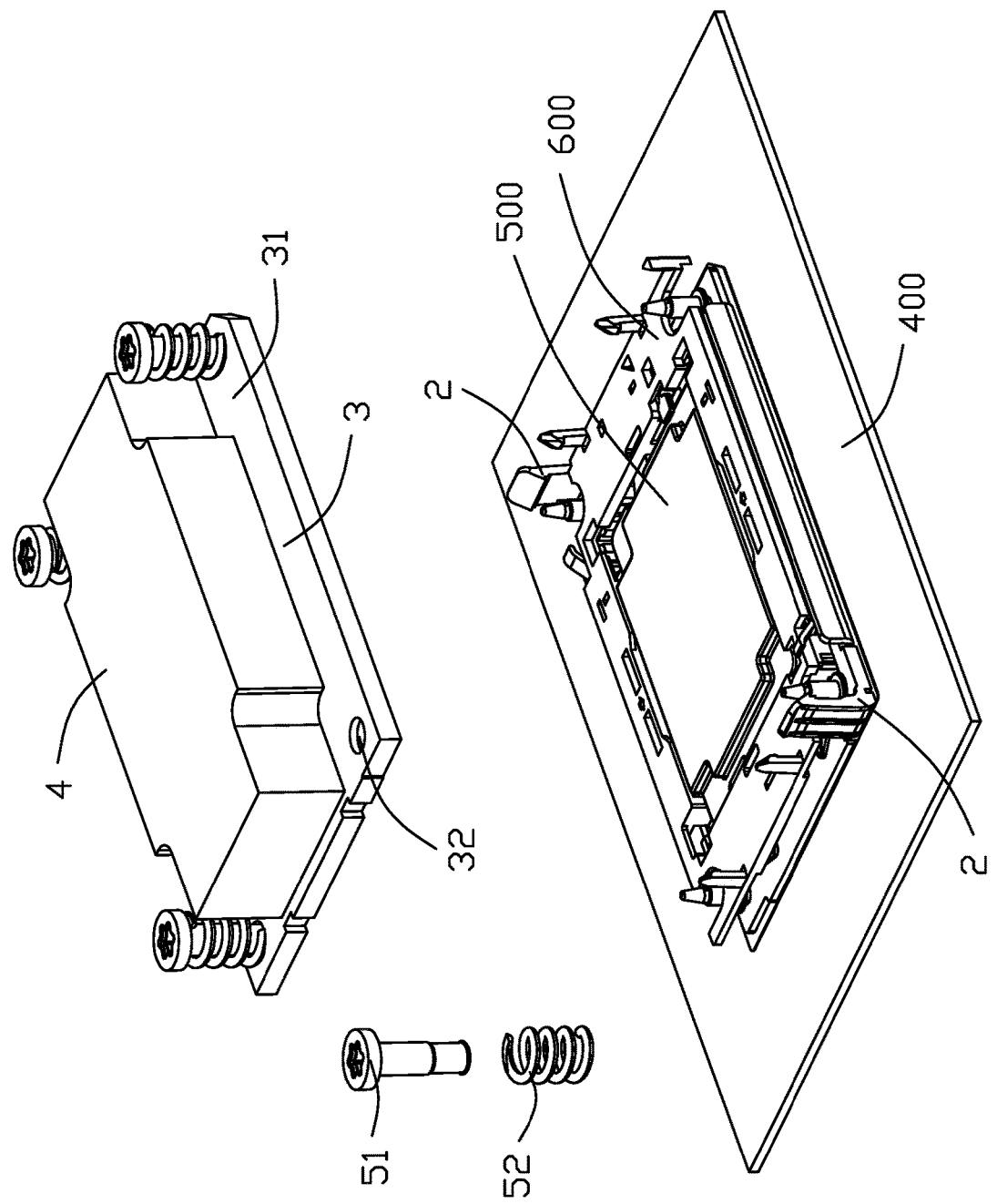
FIG. 2 is an exploded perspective view of the electrical connector assembly of FIG. 1.
Figure 3:
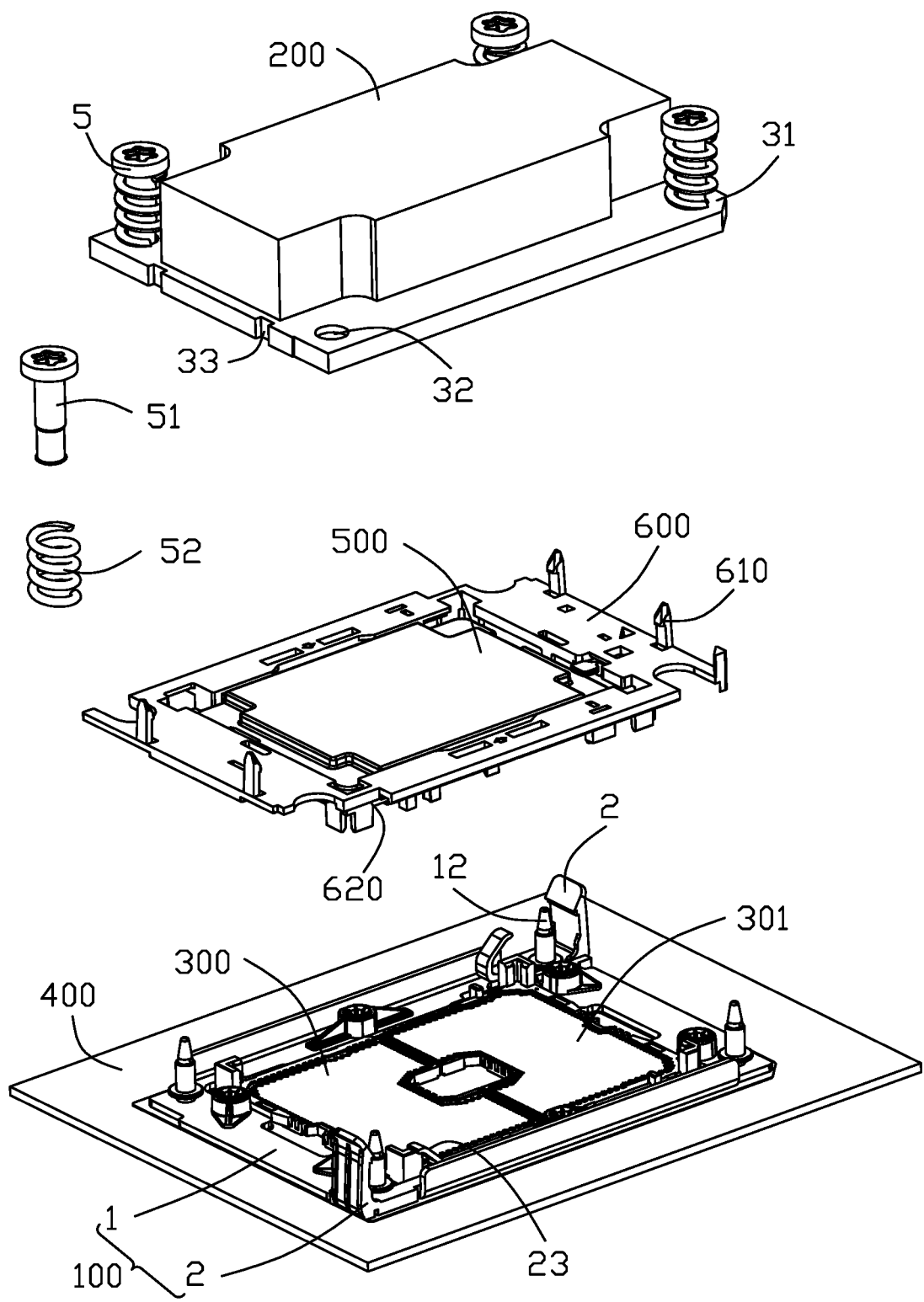
FIG. 3 is a further exploded perspective view of the electrical connector assembly of FIG. 2.
Figure 4:
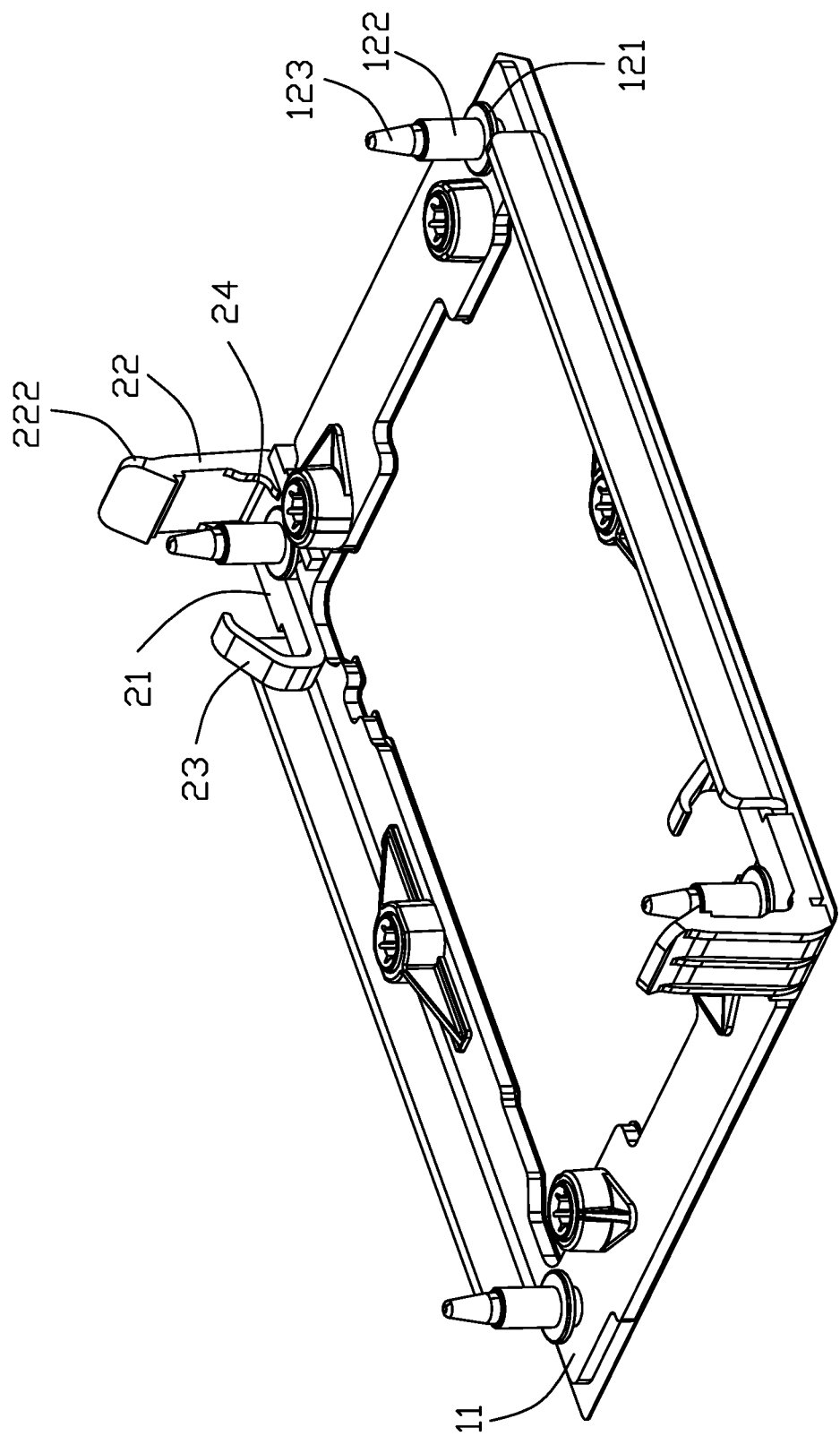
FIG. 4 is a perspective view of the fastening mechanism of the electrical connector assembly of FIG. 1.
Figure 5:
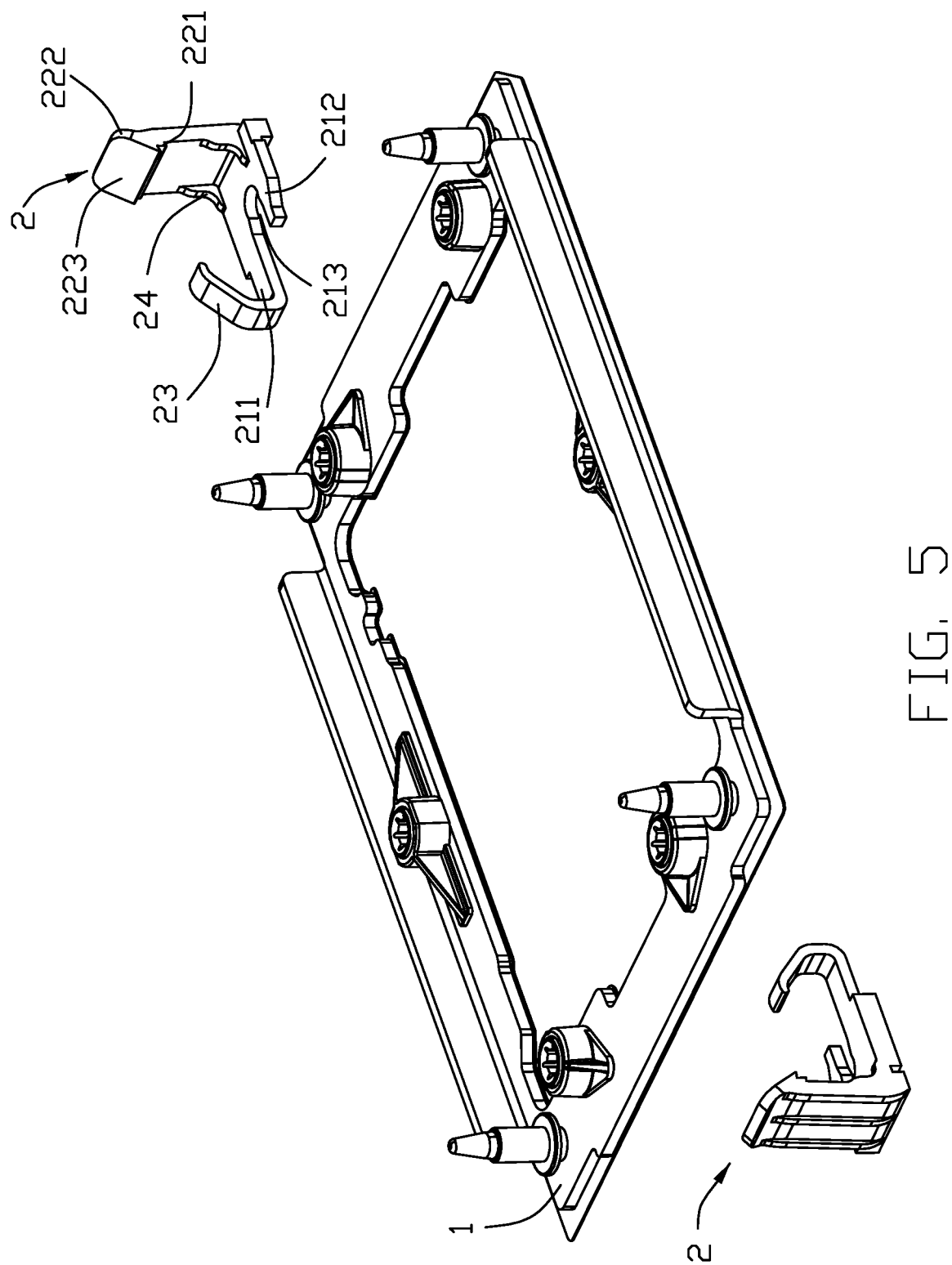
FIG. 5 is an exploded view of the fastening mechanism of the electrical connector assembly of FIG. 4.
Figure 6:
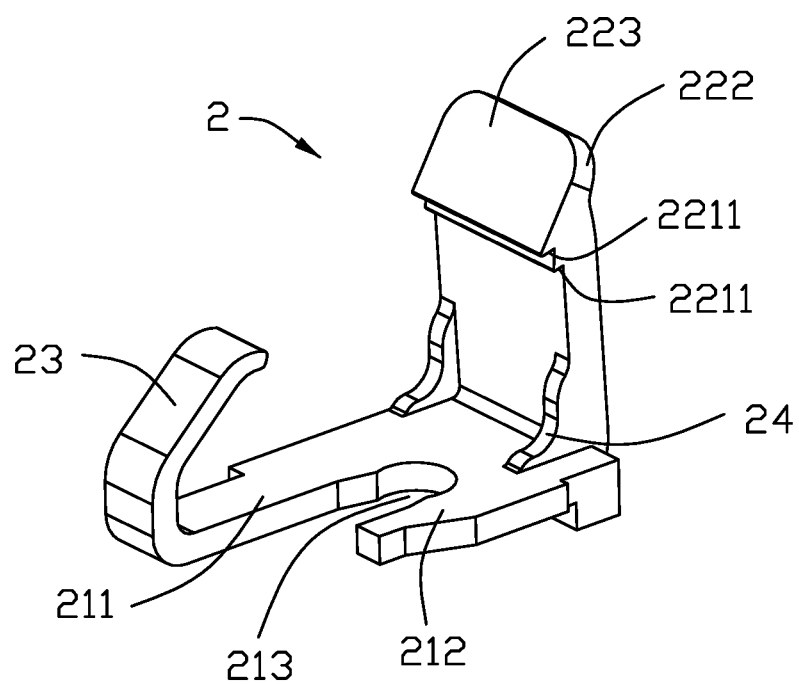
FIG. 6 is a perspective view of the fastening clip of the fastening mechanism of the electrical connector assembly of FIG. 1.
Figure 7:
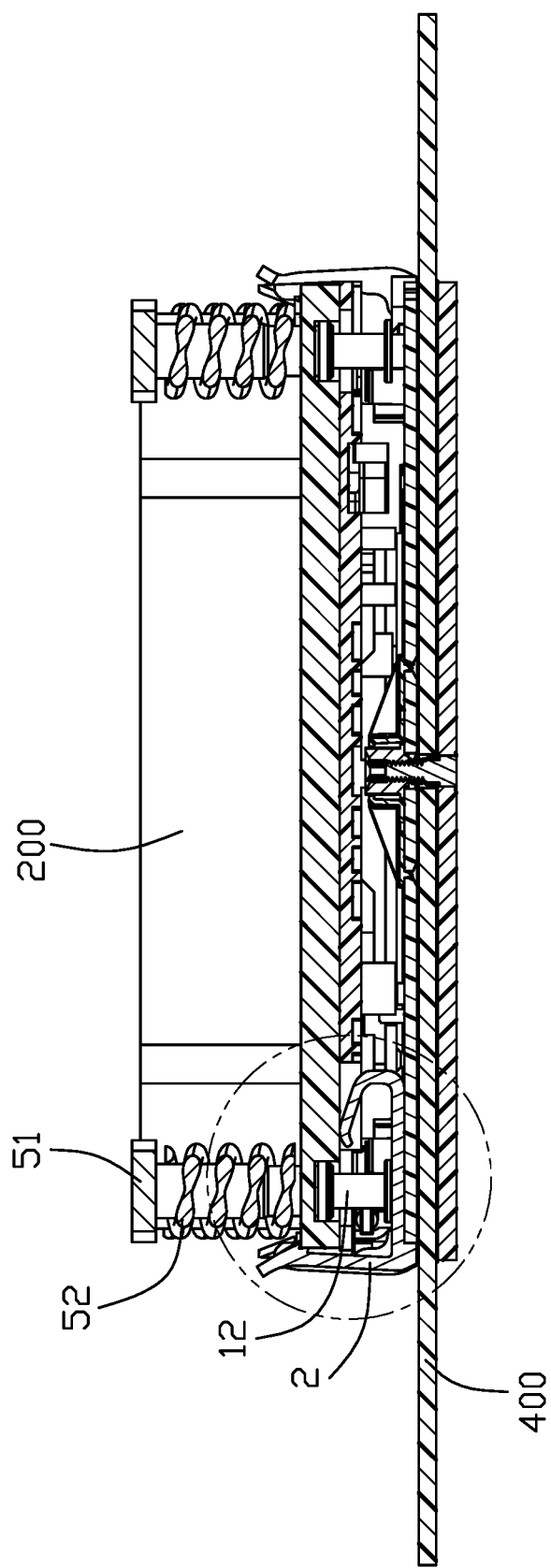
FIG. 7 is a cross-sectional view of the electrical connector assembly of FIG. 1.
Figure 8:
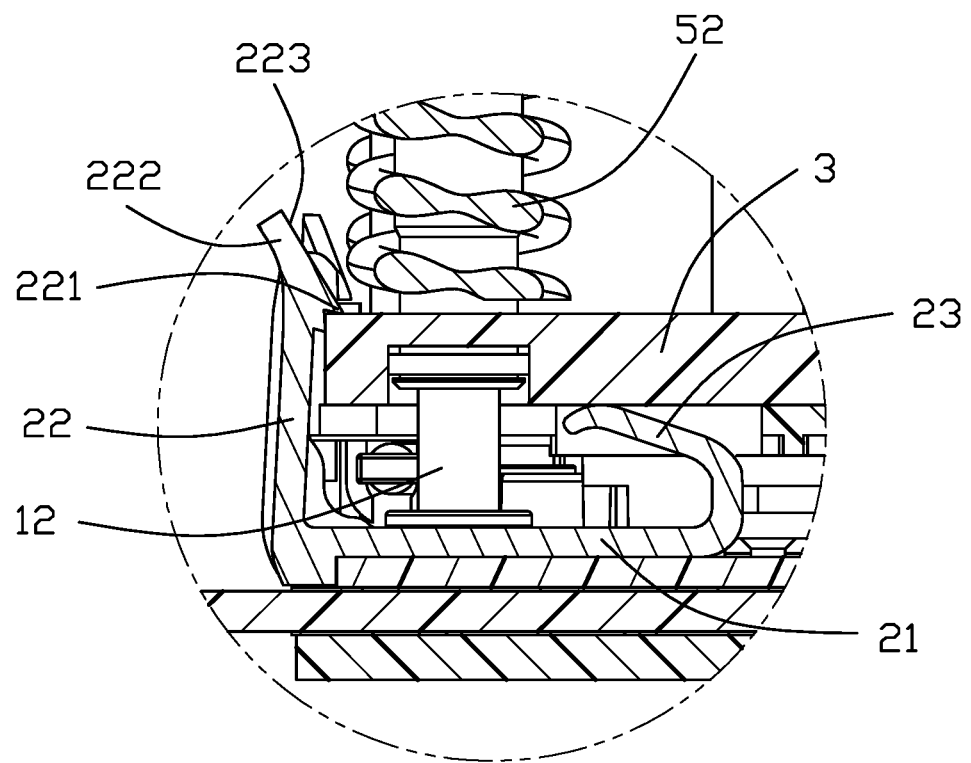
FIG. 8 is an enlarged cross-sectional view a portion of the electrical connector assembly of FIG. 7.

Referring to FIGS. 1-8, an electrical connector assembly for connecting a CPU 500 and a PCB (printed circuit board) 400, includes an electrical connector 300 mounted upon the PCB 300 for receiving a CPU or electronic package 500, and a fastening mechanism 100 for retaining a heat sink 200 upon the CPU 500. The electrical connector 300 includes an insulative housing 301 and a plurality of contacts (not shown) in the housing. The CPU 500 is positioned upon the housing 301 to mechanically and electrically connect to the contacts (not shown). In this embodiment, the CPU 500 is retained by an insulative retainer 600 which is used to precisely load the CPU upon the electrical connector 300.

The fastening mechanism 100 includes a metallic fastening seat 1 surrounding the electrical connector 300 and a pair of fastening clips 2. The fastening seat 1 defines four corner regions 11, and four alignment posts 12 extending upwardly from the four corner regions 11, respectively. Each alignment post 12 includes an upstanding section 122 extending upwardly from the corresponding corner region 11, a retaining section 121 outwardly protruding from a lower position of the upstanding section 122 to form a ring, and a screw section 123 at an end of the upstanding section 122. The two fastening clips 2 are respectively located two opposite diagonal corner regions 11. Each fastening clip 2 includes a mounting section 21 retained to the corresponding corner region 11 under the retaining section 121, a deflectable latching arm 22 extending upwardly from an outer end of the mounting section 21, a resilient/spring arm 23 extending curvedly from an inner end of the mounting section 21, and a pair of reinforcement ribs 24 on an jointing area of the mounting section 21 and the latching arm 22.

The mounting section 21 is perpendicular to the latching arm 22, and includes a first beam 211 and second beam 212 with a notch 213 therebetween. The spring arm 23 unitarily extends from a free end of the first beam 211. The lower portion of the alignment post 12 is snugly received within an inner end of the notch 213 while the retaining section 122 downwardly restrains the mounting section 21 so as to retain the fastening clip 2 at the corresponding corner region 11.

The latching arm 22 includes a latching section 221 to downwardly abut against the heat sink 200. The latching section 221 forms a step structure to form two spaced pressing surfaces 2211 for complying with two different thickness CPUs 500. Each latching arm 22 further includes an upwardly oblique guiding face 223 for easily downwardly loading the heat sink 200. The oblique guiding face 223 also provides an operation area for outwardly deflecting the latching arm 22 to remove the heat sink 200 therefrom.

The spring arm 23 constantly upwardly urges the bottom face of the heat sink 200 whereby the spring arm 23 will push the heat sink 200 upwardly automatically when the latching arm 22 is outwardly deflected to release the heat sink 200. In this embodiment, the two fastening clips 2 are respectively located at two diagonal corner regions 11 so as to ease assembling and/or disassembling the heat sink 200 with regard to the fastening mechanism 100.

The heat sink 200 includes a base plate 3 and a main body 4 formed on the base plate 3. The base plate 3 defines four corner regions 31 with corresponding through holes 32 through which the four alignment posts 12 extend. Notably, the spring arms 23 upwardly abut against the bottom surface of the base plate 3.

Each alignment post 12 is equipped with a securing unit 5 for securing the heat sink 200 thereto. The securing unit 5 includes a screw nut 51 to secure to the screw section 123 of the corresponding alignment post 12, and a coil spring 52 surrounding the screw nut 51. In this embodiment, the screw nut 51 extends through the corresponding through hole 32 to secure to the screw section 123 of the corresponding alignment post 12 which also extends through the same through hole 32. Notably, because the bottom end of the coil spring 52 downwardly presses the upper surface of the corner region 11 so as to assure the reliable mechanical and electrical connection between the CPU 500 and the contacts (not shown) of the electrical connector 300, and maximize heat dissipation between the CPU 500 and the heat sink 200. In this embodiment, the retainer 600 includes four retaining latches 610 respectively engaged within the corresponding recesses 33 of the heat sink 200 for minor retention therebetween that may help loading/unloading the heat sink 200 with regard to the fastening mechanism 100. The retainer 600 further forms cutouts 620 to allow the corresponding spring arms 23 extending therethrough for reaching the heat sink 200.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
a printed circuit board (PCB);
an electrical connector mounted upon the PCB;
an electronic package seated upon the electrical connector;
a heat sink removably attached upon the electronic package and defining a plurality of through holes at corresponding corners, respectively;
a fastening mechanism including:
a fastening seat positioned upon the PCB and surrounding the electrical connector, a plurality of alignment posts extending upwardly from corners thereof in alignment with the corresponding through holes of the heat sink, respectively, and
a plurality of fastening clips mounted to the fastening seat around the corresponding alignment posts, respectively; wherein
each fastening clip includes a deflectable latching arm downwardly restrains the heat sink.

2. The electrical connector assembly as claimed in claim 1, wherein each fastening clip further includes a spring arm constantly urging the heat sink upwardly when said heat sink is seated upon the electronic package.

3. The electrical connector assembly as claimed in claim 1, wherein the latching arm is located adjacent to an edge of the fastening seat.

4. The electrical connector assembly as claimed in claim 1, wherein the fastening clip includes a horizontal mounting section sandwiched between a retaining section of the alignment post and the heat seat in a vertical direction.

5. The electrical connector assembly as claimed in claim 4, wherein said mounting section forms a notch, and the corresponding alignment post is received at an inner end of the notch.

6. The electrical connector assembly as claimed in claim 1, wherein the alignment post forms a screw section at a top region, and is equipped with a nut associated with a spring to secure to the screw section with the spring downwardly pressing the heat sink.

7. The electrical connector assembly as claimed in claim 6, wherein at least one of the nut and the corresponding alignment post extends the corresponding through hole.

8. The electrical connector assembly as claimed in claim 1, wherein the fastening clips are only positioned at two opposite diagonal corners of the fastening seat.

9. The electrical connector assembly as claimed in claim 1, further including a retainer to retain the electronic package thereto, wherein said retainer includes a plurality of retaining latches to hold the heat sink.

10. The electrical connector assembly as claimed in claim 9, wherein said heat sink forms a plurality of recesses to receive the corresponding retaining latches therein.

11. An electrical connector assembly for mounting upon a printed circuit board, comprising:
an electrical connector;
an electronic package seated upon the electrical connector;
a metallic fastening mechanism including:
a fastening seat surrounding the electrical connector;
a plurality of alignment posts extend upwardly from corresponding corners of the heat seat, each of said alignment post forming a screw section at a top portion; and
a plurality of fastening clips secured at the corresponding corners, respectively, each of said fastening clips including a deflectable latching arm for downwardly restraining a heat sink which is adapted to be seated upon the electronic package for heat dissipation.

12. The electrical connector assembly as claimed in claim 11, wherein each of said fastening clips further includes a spring arms for constantly urging the heat sink when the heat sink is positioned upon the electronic package.

13. The electrical connector assembly as claimed in claim 12, further including an insulative retainer for holding the electronic package thereto, wherein the retainer forms corresponding cutouts to allow the spring arms of the corresponding fastening clips to extend upwardly therethrough.

14. The electrical connector assembly as claimed in claim 11, wherein the latching arm is adjacent to an outer edge of the fastening seat.

15. The electrical connector assembly as claimed in claim 14, wherein each of said fastening clips further includes a horizontal mounting section with a notch to receive the corresponding alignment post therein.

16. A metallic fastening mechanism for holding a heat sink upon an electronic package upon an electrical connector a mounted upon a printed circuit board, comprising:
a fastening seat adapted to surround the electrical connector;
a plurality of alignment posts extending upwardly from corresponding corners of the fastening seat, each of said alignment post forming a screw section on a top portion;
a plurality of fastening clips secured at the corresponding corners, respectively, each of said fastening clips including a horizontal mounting section and a deflectable latching arm extending upwardly from one end of the mounting section for downwardly restraining the heat sink.

17. The fastening mechanism as claimed in claim 16, wherein each of said alignment posts is further equipped with a screw nut adapted to be secured to the screw section, and a spring surrounding the screw nut adapted to downwardly pressing the heat sink.

18. The fastening mechanism as claimed in claim 16, wherein each fastening clips further including a spring arm extending curvedly from the mounting section for upwardly urging the heat sink.

19. The fastening mechanism as claimed in claim 16, wherein the mounting section forms a notch to receive the corresponding alignment post therein.

20. The fastening mechanism as claimed in claim 19, wherein a ring type retaining section is formed on the corresponding alignment post to downwardly restrain the corresponding mounting section.

* * * * *